(12) United States Patent
Ito et al.

(10) Patent No.: US 6,897,414 B2
(45) Date of Patent: May 24, 2005

(54) CERAMIC HEATER FOR SEMICONDUCTOR MANUFACTURING/TESTING APPARATUS

(75) Inventors: Yasutaka Ito, Gifu (JP); Kazutaka Mashima, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/069,511

(22) PCT Filed: Jul. 3, 2001

(86) PCT No.: PCT/JP01/05742

§ 371 (c)(1),
(2), (4) Date: Jun. 24, 2002

(87) PCT Pub. No.: WO02/03434

PCT Pub. Date: Jan. 10, 2002

(65) Prior Publication Data

US 2002/0190054 A1 Dec. 19, 2002

(30) Foreign Application Priority Data

Jul. 3, 2000 (JP) .................................. 2000-201060

(51) Int. Cl.⁷ ................................................ H05B 3/68
(52) U.S. Cl. ............................. 219/444.1; 219/460.1; 219/461.1; 219/465.1; 219/466.1; 219/543; 219/467.1; 219/468.1
(58) Field of Search .................... 219/444.1, 460.1, 219/461.1, 465.1, 466.1, 467.1, 468.1, 543–544, 546–548; 118/724–725

(56) References Cited

U.S. PATENT DOCUMENTS

| 4,002,883 A | * | 1/1977 | Hurko ........................ 219/543 |
| 6,080,970 A | | 6/2000 | Yoshida et al. |
| 6,465,763 B1 | | 10/2002 | Ito et al. |
| 6,475,606 B2 | | 11/2002 | Niwa |
| 6,507,006 B1 | | 1/2003 | Hiramatsu et al. |
| 6,677,557 B2 | | 1/2004 | Ito et al. |
| 2002/0043527 A1 | | 4/2002 | Ito |
| 2003/0015521 A1 | | 1/2003 | Ito |

FOREIGN PATENT DOCUMENTS

| JP | 5-307994 | 11/1993 |
| JP | 9-40481 | 2/1997 |

* cited by examiner

Primary Examiner—Shawntina Fuqua
(74) Attorney, Agent, or Firm—Oblon, Spivak, McClelland, Maier & Neustadt, P.C.

(57) ABSTRACT

A ceramic heater for a semiconductor producing/examining device having a resistance heating element superior in adhesion to a substrate. The ceramic heater includes a ceramic substrate and a resistance heating element formed on the surface of the ceramic substrate. Further, irregularities are formed on the side face of the resistance heating element.

8 Claims, 5 Drawing Sheets

|←  0.5mm  →|

400
CERAMIC HEATER FOR SEMICONDUCTOR MANUFACTURING/TESTING APPARATUS

TECHNICAL FIELD

The present invention relates to a ceramic heater for a semiconductor producing/examining device, which is used mainly in the semiconductor industry.

BACKGROUND ART

Semiconductors are very important products necessary in various industries, and a semiconductor chip is produced, for example, by slicing a silicon monocrystal into a predetermined thickness to manufacture a silicon wafer, and then forming plural integrated circuits etc. on this silicon wafer.

In the manufacturing process of this semiconductor chip, the silicon wafer put on an electrostatic chuck is subjected to various treatments such as etching and CVD, to form a conductor circuit, an element and so on. A resin for a resist is applied thereto and is then heated and dried.

For such heating, a ceramic heater is used. JP Kokai Hei 11-40330 and so on disclose a ceramic heater in which a substrate made of a carbide ceramic or a nitride ceramic is used and resistance heating elements are formed on the face opposite to a heating face of this ceramic heater (referred to as the bottom face hereinafter).

SUMMARY OF THE INVENTION

However, in the ceramic heater described in JP Kokai Hei 11-40330, the resistance heating elements are formed to be drawn as curves (concentric circles), so that a problem that the resistance heating elements exfoliate by rapid temperature-rise or rapid temperature-drop is found.

In light of the above-mentioned problem, an object of the present invention is to provide a ceramic heater for a semiconductor producing/examining device, which has a resistance heating element superior in adhesion to a substrate.

The inventors made eager studies to solve the above-mentioned problem. As a result, the inventors have found out that, by forming irregularities on the side face of a resistance heating element formed to be drawn as a curve, the adhesion thereof to a ceramic substrate is improved, and that even if the resistance heating element has thermal expansion or contraction, the resistance heating element does not exfoliate from the substrate. Thus, the present invention has been achieved.

That is, the present invention is a ceramic heater for a semiconductor producing/examining device including: a ceramic substrate; and a resistance heating element formed on the surface of the ceramic substrate, wherein irregularities are formed on the side face of the resistance heating element.

Since the irregularities are present on the side face of the resistance heating element in the ceramic heater for the semiconductor producing/examining device of the present invention, a contact area between the ceramic heater and the resistance heating element can be ensured, so that the resistance heating element does not exfoliate easily from the substrate. Particularly when the resistance heating element is formed to be drawn as a curve, stress resulting from expansion or contraction of the resistance heating element, is applied to the contact portion between the side face of the resistance heating element and the ceramic substrate by thermal shock or in a heat cycle. Thus, the resistance heating element exfoliates easily. In the present invention, however, the distance of the above-mentioned contact portion is long; therefore, the contact area becomes large so that problems of the exfoliation and the like does not occur. Further, even if air is blown against the resistance heating element, the resistance heating element does not exfoliate. It is therefore easy to cool the ceramic substrate forcibly.

The size of the irregularities on the side face is desirably 100 µm or less, and is optimally 50 µm or less. If the size of the irregularities on the side face exceeds 100 µm, the irregularities have a function as heat-radiating fans, therefore, heat remains in a space around the resistance heating element so that the temperature of the face opposite to the face on which the resistance heating element is formed (referred to as the heating face hereinafter) does not become even. On the other hand, if the size is 50 µm or less, the irregularities are easily formed by printing.

Figure 4:
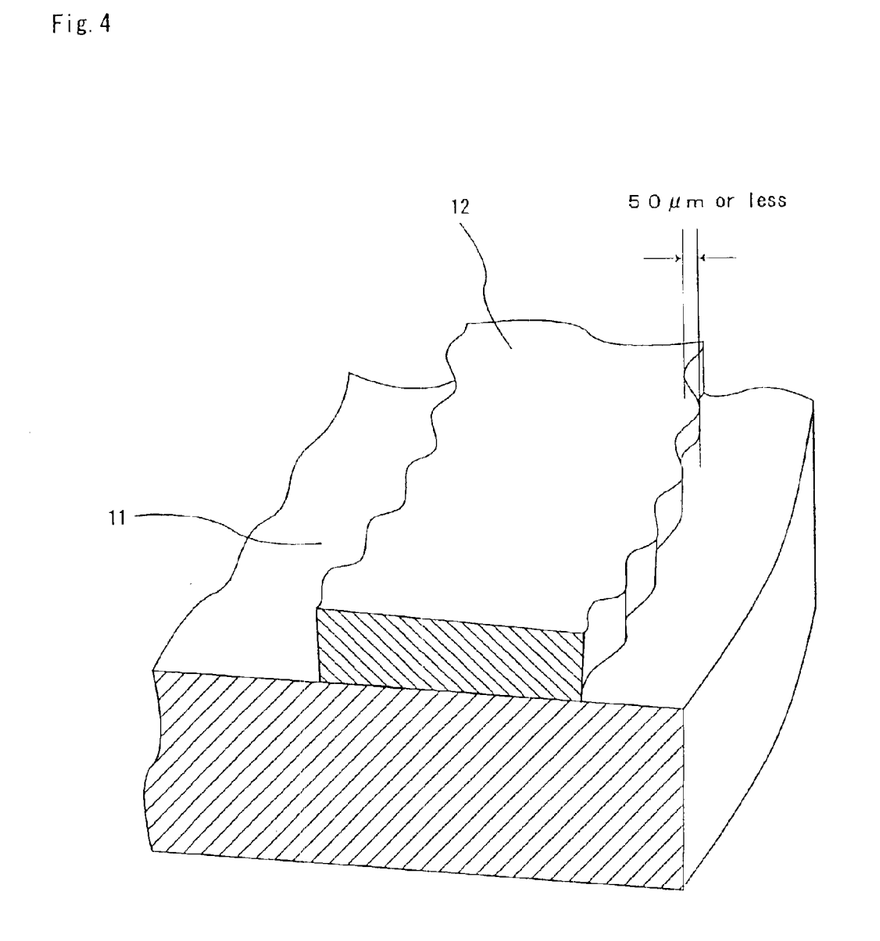
FIG. 4 is a perspective view schematically showing a resistance heating element formed on a ceramic substrate in a ceramic heater for a semiconductor producing/examining device of the present invention.
Figure 5:
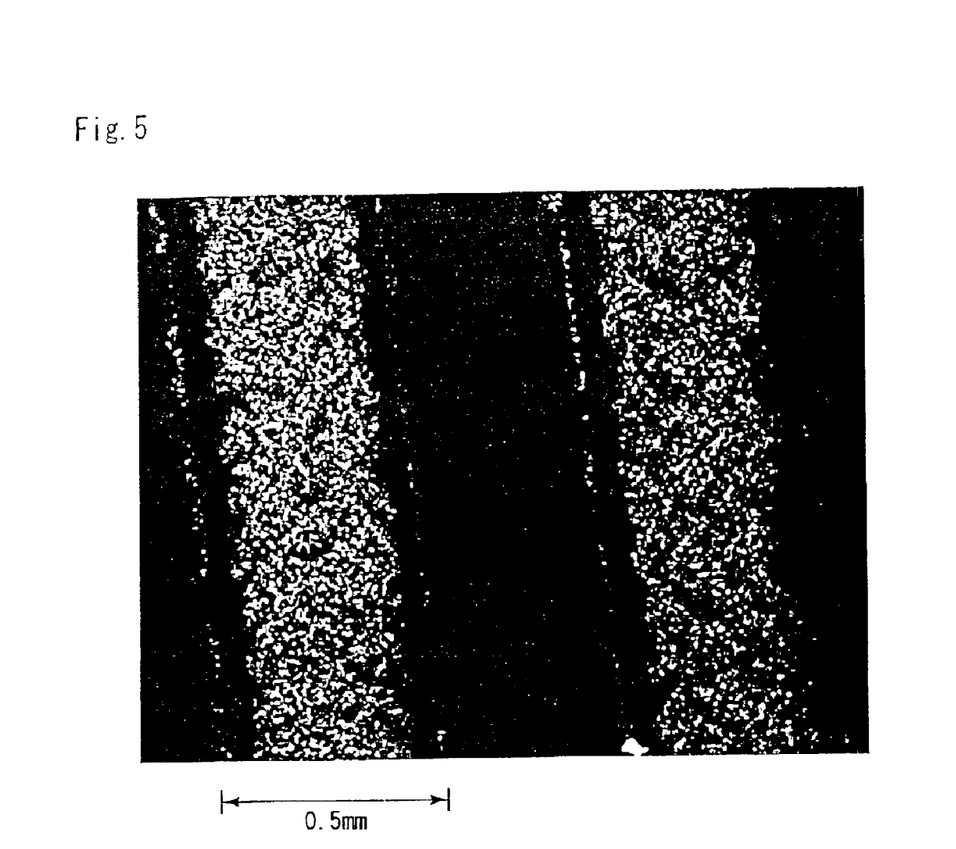
FIG. 5 is an optical microscopic photograph showing a resistance heating element formed on a ceramic substrate in a ceramic heater for a semiconductor producing/examining device of the present invention.

The irregularities on the side face, referred to in the present specification, mean the condition that both sides of the resistance heating element are formed to be drawn as waving curves, when viewed from the above. The side face itself is desirably formed to be substantially perpendicular to the ceramic substrate, as shown in FIG. 4. Though, a few irregularities may be formed in the height direction of the side face. FIG. 5 is an optical microscopic photograph showing a resistance heating element in which such irregularities are formed.

The resistance heating element is desirably formed to be drawn as a curve as a whole. The shape thereof is desirably concentric circles, a spiral, a winding line and the like. In the case that the ceramic substrate is in a disc shape, the temperature of the heating face is easily made even. In the case of the resistance heating element being drawn as such a curve, the resistance heating element exfoliates easily by thermal shock or in a heat cycle. In such a case, a structure wherein the irregularities are formed on the side face of the resistance heating element, as seen in the present invention, is advantageous.

The method of measuring the size of the irregularities formed on the side face of the resistance heating element includes the steps of: taking photographs of 10 positions with a planar view which are arbitrarily selected, each of which is as shown in FIG. 5, with an optical microscope or an electron microscope; measuring the maximum difference in height between the deepest concave portion and the highest convex portion in each of the photographs; and defining an average of the maximum differences of the 10 photographs as the size of the irregularities. Therefore, the average maximum difference in height of the irregularities is defined as the size of the irregularities.

If the size of irregularities at an opening in a screen printing plate is even, the breadth of the irregularities is defined as the size of the irregularities.

The size of the irregularities is desirably 0.05 µm or more. This is because the advantageous effects of the present invention are hardly produced if the size is less than 0.05 µm.

When the size of the irregularities is from 0.05 to 100 µm, extreme flow of air between circuits is suppressed. Therefore, rapid temperature-drop does not occur so that the evenness of the temperature is ensured.

Furthermore, the present invention is effective for the case in which the resistance heating element is drawn as a curve pattern. In any straight line pattern, the problem of exfoliation is hardly occurred.

Moreover, in the case that at least one part of the resistance heating element is formed in parallel, flow of atmospheric gas such as air between the patterns of the heating element becomes a problem. Thus, the adjustment of the irregularities on the side face becomes effective.

Explanation of Symbols

| | |
|---|---|
| 10 | ceramic heater |
| 11 | ceramic substrate |
| 12 (12a to 12d) | resistance heating element |
| 13 | terminal portion |
| 14 | bottomed hole |
| 15 | through hole |
| 16 | lifter pin |
| 17 | external terminal |
| 18 | temperature-measuring element |
| 170 | solder layer |
| 180 | insulating layer |

DETAILED DISCLOSURE OF THE INVENTION

The present invention will be described in accordance with embodiments of the invention hereinafter.

In a ceramic heater for a semiconductor producing/examining device (which may be referred to merely as a ceramic heater hereinafter) according to the present embodiment, a nitride ceramic or a carbide ceramic is used as its ceramic substrate. An insulating layer comprising an oxide ceramic is formed on a surface of the ceramic substrate, and resistance heating elements are formed thereon.

As for a nitride ceramic, the volume resistivity thereof drops easily at high temperature by the formation of solid-solution of oxygen and the like. Also, a carbide ceramic has electric conductivity so far as the ceramic is not prepared to have a particularly high purity. Thus, by forming an insulating layer comprising an oxide ceramic, a short circuit between circuits at high temperature can be prevented. Also, by forming the insulating layer, a short circuit between the circuits can be prevented even if the carbide ceramic and the like contains impurities. As explained, by adopting the above constitution, the temperature controllability of the ceramic heater comprising such a material can be ensured.

However, in the case that the insulation resistance value of the ceramic substrate is sufficiently high even at high temperature, the resistance heating element may be formed directly on the bottom face of the ceramic substrate.

The surface of the bottom face of the ceramic substrate preferably has the surface roughness that Ra is from 0.01 to 20 $\mu$m, and Rmax is from 0.1 to 200 $\mu$m.

Figure 1:
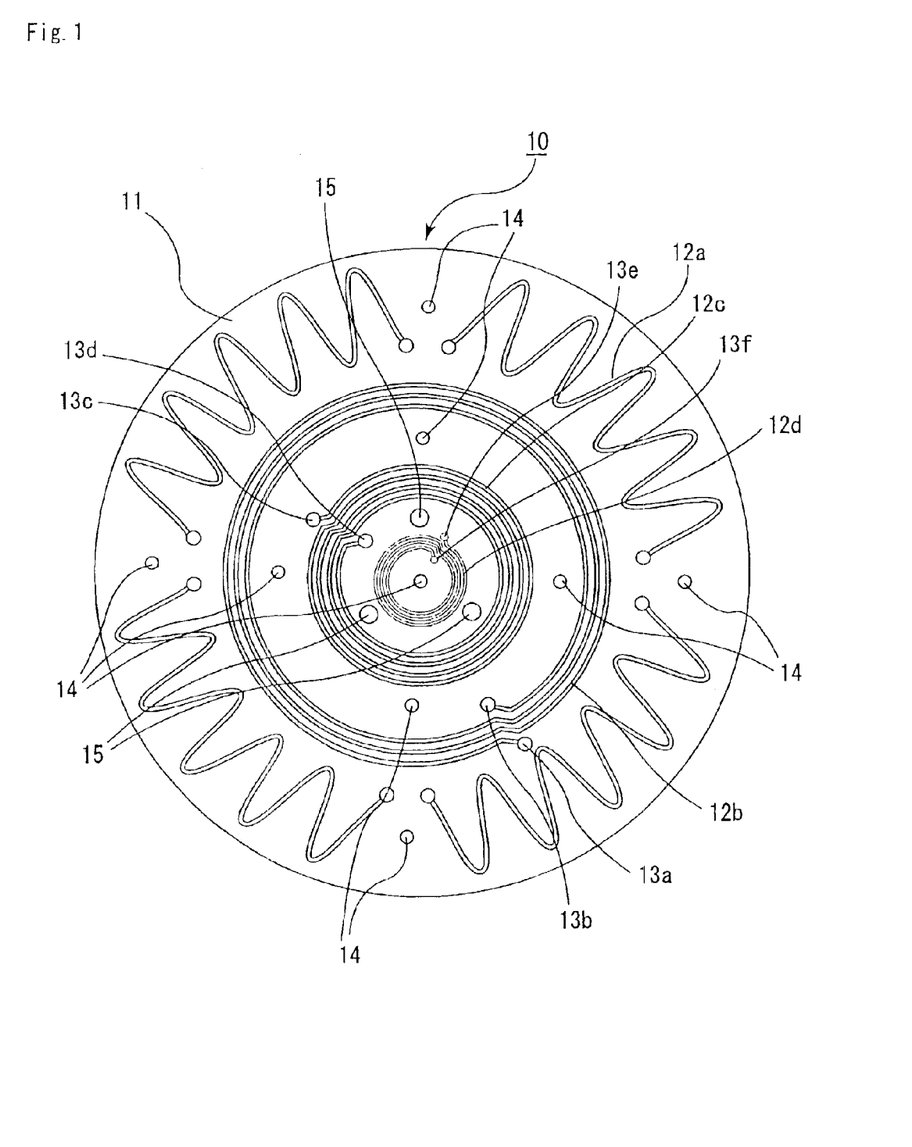
FIG. 1 is a bottom view schematically showing a ceramic heater for a semiconductor producing/examining device of the present invention.
Figure 2:
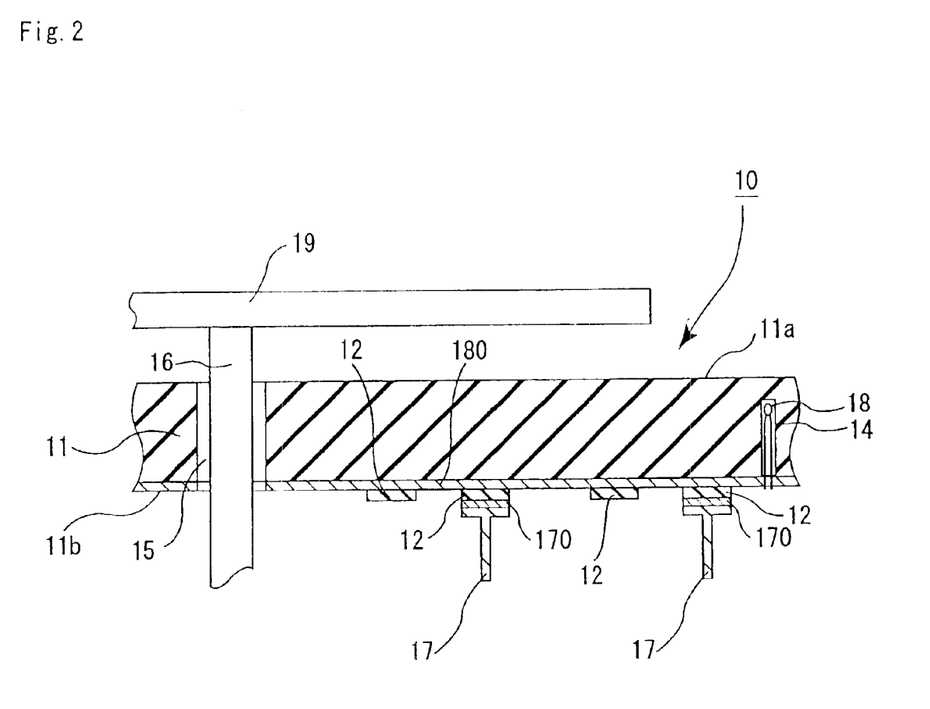
FIG. 2 is a partially-enlarged sectional view of the ceramic heater for the semiconductor producing/examining device shown in FIG. 1.

FIG. 1 is a bottom view schematically showing a ceramic heater of the present invention. FIG. 2 is a partially-enlarged sectional view schematically showing a part of the ceramic heater shown in FIG. 1.

In this ceramic heater 10, resistance heating elements 12 (12a to 12d) are formed, through an insulating layer 180, on a bottom face 11b. External terminals 17 are connected, through a solder layer 170, to terminal portions 13a to 13f of the resistance heating elements 12a to 12d.

In the ceramic heater shown in FIG. 1, no covering layer is formed on the terminal portions 13a to 13f. In other embodiments, a covering layer comprising Ni and the like is formed on only the terminal portions 13a to 13f, and the external terminals may be connected, through the solder layer, on top of the covering layer.

As described above, no covering layer is formed on the resistance heating elements 12. The resistance heating elements which are formed, for example, by applying a conductor containing paste and firing it are exposed, as they are, to the air. The resistance heating elements 12 are made up to have a pattern in which a winding line shape and a concentric circules-like shape are combined with each other, as shown in FIG. 1, in order to make the temperature of the heating face even.

On the bottom face of the ceramic substrate 11, bottom holes 14 for inserting temperature-measuring elements 18 such as thermocouples and the like are made, and further through holes 15 for inserting lifter pins 16 are made.

Examples of the nitride ceramic constituting this ceramic substrate 11 include metal nitride ceramics, such as aluminum nitride, silicon nitride, boron nitride, titanium nitride and the like.

Examples of the above-mentioned carbide ceramic include metal carbide ceramics such as silicon carbide, zirconium carbide, titanium carbide, tantalum carbide, tungsten carbide and the like.

As the ceramic substrate, an oxide ceramic may be used, and alumina, silica, cordierite, mullite, zirconia, beryllia and the like can be used.

In the present invention, it is desired that the ceramic substrate contains a sintering aid. As the sintering aid of aluminum nitride, for example, an alkali metal oxide, an alkali earth metal oxide or a rare earth element oxide may be used. Among these sintering aids, CaO, $Y_2O_3$, $Na_2O$, $Li_2O$ and $Rb_2O$ are particularly preferred. Alumina may also be used. The content of these sintering aids is desirably from 0.1 to 20% by weight.

In the case of silicon carbide, it is desired to use $B_4C$, C or AlN as the sintering aid.

In the present invention, the ceramic substrate desirably contains from 5 to 5000 ppm of carbon.

This is because the ceramic substrate can be blackened by incorporating carbon and, thus, when the substrate is used as a heater, radiation heat can be sufficiently used.

Carbon may be amorphous or crystalline. When amorphous carbon is used, a drop in the volume resistivity at high temperature can be prevented. When crystalline carbon is used, a drop in the thermal conductivity at high temperature can be prevented. Therefore, both of crystalline carbon and amorphous carbon may be used dependently on use. The carbon content is more preferably from 50 to 2000 ppm.

The diameter of the ceramic substrate according to the present invention is desirably 200 mm or more, more desirably 12 inches (300 mm) or more. This is because semiconductor wafers having such a diameter become the main current of the next-generation semiconductor wafers.

The diameter of the above-mentioned ceramic substrate is desirably equal to or larger than that of the silicon wafer.

The thickness of the ceramic substrate according to the present invention is desirably 50 mm or less, and more desirably 25 mm or less.

If the thickness of the ceramic substrate exceeds 25 mm, the heat capacity of the ceramic substrate becomes large. Particularly when a temperature control means is provided to heat or cool the substrate, temperature following character deteriorates on the basis of the large heat capacity.

The thickness of the ceramic substrate is optimally 5 mm or more. It is desirable that the thickness exceeds 1.5 mm.

The variation of the thickness of the ceramic substrate is preferably within ±3%. The variation of the thermal conductivity is preferably within ±10%. The reason is that, in order to make the temperature of the heating face of the ceramic substrate even, it is desired that the variations of the thickness and the thermal conductivity of the ceramic substrate are set within the above-mentioned ranges.

In the present invention, it is desired to form an insulating layer on the bottom face of the ceramic substrate, as shown in FIG. 2. As this insulating layer, an oxide ceramic is desirable. Specifically, silica, alumina, mullite, cordierite, beryllia and the like can be used.

Such an insulating layer may be an insulating layer formed by spin-coating the ceramic substrate with a sol solution in which an alkoxide is hydrolyzed and polymerized, and then drying and firing the resultant, or an insulating layer formed by sputtering, CVD and the like. An insulating layer comprising an oxide may be disposed by subjecting the surface of the ceramic substrate to oxidizing treatment.

In the ceramic heater of the present invention, a semiconductor wafer may be put on a wafer-putting surface of the ceramic substrate in the state that they contact each other. Besides, the semiconductor wafer may be supported by supporting pins, supporting spheres and the like, and held in the state that a predetermined interval is kept between the semiconductor wafer and the ceramic substrate. The separated distance is desirably from 5 to 5000 $\mu$m.

As shown in FIG. 2, by inserting the lifter pins 16 into the through holes 15 in the ceramic substrate 11 to support a semiconductor wafer such as a silicon wafer 19 and the like, and subsequently moving the lifter pins 16 upward or downward, the semiconductor wafer can be received from a carrier machine or the semiconductor wafer can be put on the ceramic substrate. Alternatively, the semiconductor wafer can be heated while it is supported.

The through holes 15 desirably have the surface roughness that Rmax is from 0.05 to 200 $\mu$m, and Ra is from 0.005 to 20 $\mu$m.

In the case that pores are present inside the above-mentioned ceramic substrate, the pores are desirably closed pores. The quantity of helium passing through the ceramic substrate (helium leakage quantity) is desirably $10^{-7}$ Pa·m³/sec or less. This is because gas leakage of a coolant for forcible cooling can be prevented.

The volume resistivity of the ceramic substrate used in the ceramic heater of the present invention, or the volume resistivity of the insulating layer is desirably $10^5$ Ω·cm or more at 100° C. or higher. This is to ensure the insulation between resistance heating elements.

The flatness of the ceramic substrate is advantageously 50 $\mu$m or less.

The ceramic heater of the present invention is a device used for producing or examining a semiconductor. Specific examples of the device include an electrostatic chuck, a wafer prober, a susceptor and the like, as well as a ceramic heater in which only resistance heating elements are provided in a ceramic substrate.

In the above-mentioned electrostatic chuck, not only the resistance heating elements but also an electrostatic electrode, an RF electrode and so on are formed inside the ceramic substrate. In the above-mentioned wafer prober, a chuck top conductor layer as a conductor is formed on the surface and further a guard electrode and a ground electrode as conductors are formed inside.

The ceramic substrate for a semiconductor device according to the present invention is desirably used at 100° C. or higher, and is most preferably used at 200° C. or higher.

If necessary, in the present invention, temperature-measuring elements 18 such as thermocouples and the like may be buried in the bottomed holes 14 in the ceramic substrate 11, as shown in FIG. 2. This is because these temperature-measuring elements 18 make it possible to measure the temperature of the resistance heating elements and, on the basis of the resultant data, voltage or electric current quantity is changed so that the temperature can be controlled.

It is preferable that the size of the connecting portions of the metal wires of the thermocouples is the same as the strand diameter of the respective metal wires or more, and is 0.5 mm or less. Such a structure makes the heat capacity of the connecting portions small, and causes a temperature to be correctly and speedy converted to a current value. For this reason, temperature controllability is improved so that temperature distribution on the heating face of the wafer becomes small.

Examples of the thermocouples include K-type, R-type, B-type, S-type, E-type, J-type and T-type thermocouples, described in JIS-C-1602 (1980).

It is allowable to use brazing gold, brazing silver and the like to adhere the temperature-measuring elements to the bottoms of the bottomed holes 14, or to insert the temperature-measuring elements into the bottomed holes 14 and then seal the holes with a heat resistant resin and the like. The two methods may be combined with each other.

Examples of the above-mentioned heat resistant resin include thermosetting resins, in particular epoxy resin, polyimide resin, bismaleimide-triazine resin and the like. These resins may be used alone or in combination of two or more.

The above-mentioned brazing gold is desirably at least one selected from an alloy made of 37 to 80.5% by weight of Au and 63 to 19.5% by weight of Cu, and an alloy made of 81.5 to 82.5% by weight of Au and 18.5 to 17.5% by weight of Ni.

These have a melting temperature of 900° C. or more and are not easily melted even in a high temperature range.

As the brazing silver, for example, a Ag—Cu type can be used.

As shown in FIG. 1, the resistance heating element 12 is desirably divided into at least two circuits, and is more desirably divided into 2 to 10 circuits. By dividing the circuit, electric power supplied to the respective circuits is controlled so that the quantity of generated heat can be changed. Thus, the temperature of the heating face 11a can be adjusted.

Examples of the pattern of the resistance heating elements include a spiral, eccentric circles, or winding lines, as well as concentric circles, and the combination of the concentric circles-like shape and the winding line shape.

In the present invention, the insulating layer is usually provided on the surface of the ceramic substrate before the resistance heating elements are formed. The insulating layer may be formed by spin-coating the ceramic substrate with a sol solution in which an alkoxide is hydrolyzed and polymerized, and then drying and firing the resultant, or may be formed by sputtering, CVD and the like. An oxide layer may be provided by firing the surface of the ceramic substrate in an oxidizing atmosphere.

In the present invention, since the resistance heating elements are formed on the surface of the ceramic substrate 11, it is preferred to use a method comprising the steps of: applying a conductor containing paste containing metal particles on the surface of the ceramic substrate 11 (the surface of the insulating layer) to form a conductor containing paste layer having a predetermined pattern; baking this; and sintering the metal particles on the surface of the ceramic substrate 11. The metal sintering is sufficient if the metal particles are melted and adhered to each other or the metal particles are melted and adhered to the ceramic.

Figure 3:
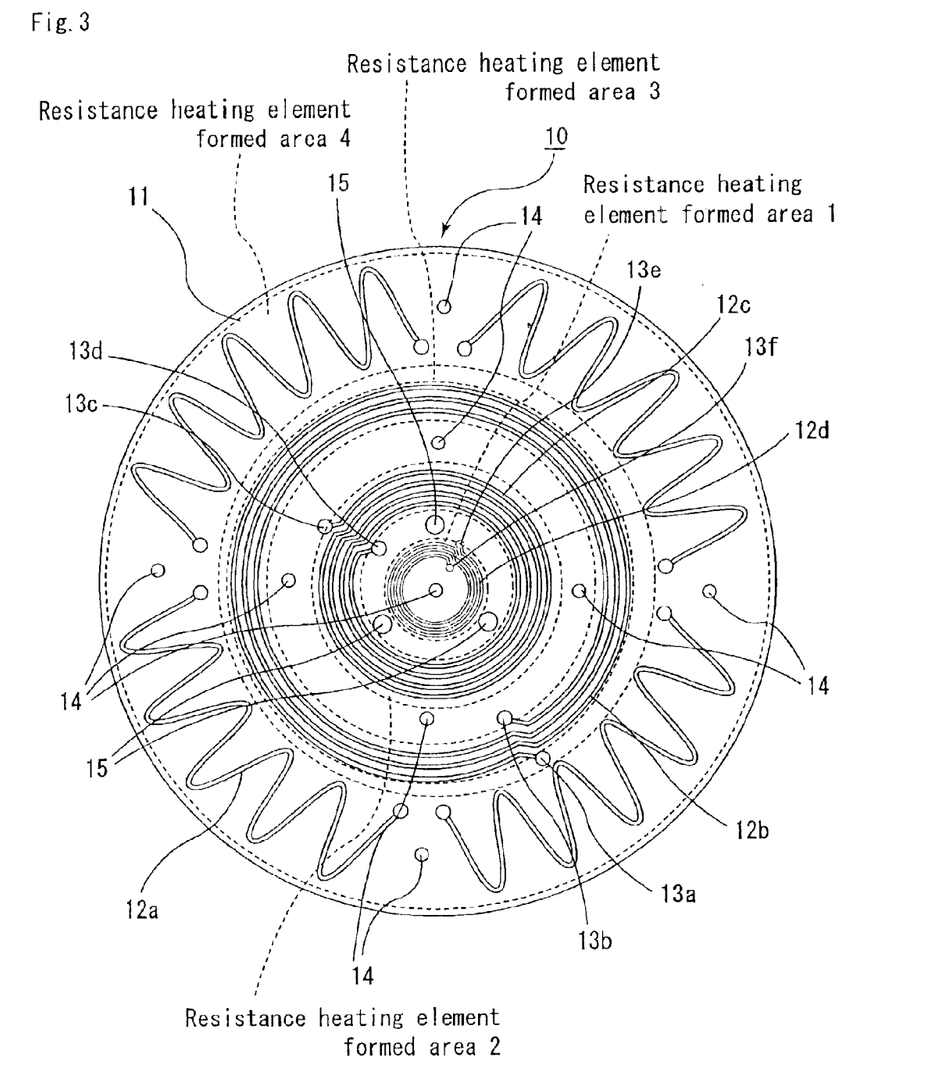
FIG. 3 is a plan view showing resistance heating element formed areas of the ceramic heater for the semiconductor producing/examining device shown in FIG. 1.

In the embodiment of the present invention, a pattern as shown in FIG. 3 is adopted as the pattern of the resistance heating elements 12. That is, the following are present on the ceramic substrate 11: an area including a portion where the resistance heating element 12d is formed (a resistance heating element formed area 1); an area including a portion where the resistance heating element 12c is formed (a resistance heating element formed area 2); an area including a portion where the resistance heating element 12b is formed (a resistance heating element formed area 3); and an area including a portion where the resistance heating elements 12a are formed (a resistance heating element formed area 4).

Buffering areas are provided between the resistance heating element formed area 1 and the resistance heating element formed area 2, between the resistance heating element formed area 2 and the resistance heating element formed area 3, and between the resistance heating element formed area 3 and the resistance heating element formed area 4.

By the presence of the buffering areas, no influence is produced on the resistance heating element formed area 1 and the resistance heating element formed area 3 even if a large electric power is supplied to the resistance heating element formed area 2 and the temperature thereof rises. It is therefore unnecessary to perform temperature-control, for example, lowering the temperature of the resistance heating element formed area 1 or the resistance heating element formed area 3 and the like. Thus, a temperature difference in the heating face can be reduced by simple control.

The outermost circumference of the resistance heating element formed areas is desirably within 35 mm from the side face of the ceramic substrate and is optimally within 25 mm therefrom. Within 25 mm, the warp amount thereof can be made very small.

The distance from the side face of the ceramic substrate to the outermost circumference of the resistance heating element formed areas is desirably 0.5 mm or more. If the distance exceeds 0.5 mm, an electric short circuit is caused or the handling property deteriorates in the case that a supporting case is made of a metal.

In this embodiment, the width of the resistance heating element formed areas is adjusted to 5 to 30% of the diameter.

In the resistance heating element formed areas, a pattern of concentric circles, a spiral and winding lines is formed. In each of the resistance heating element formed areas, a circuit comprising a single pattern is preferably formed. This is because the case of comprising the single pattern can be more easily controlled.

When the resistance heating elements are formed on the surface of the ceramic substrate 11, the thickness of the resistance heating elements is preferably from 1 to 30 $\mu$m and more preferably from 1 to 10 $\mu$m.

When the resistance heating elements are formed on the surface of the ceramic substrate 11, the width of the resistance heating elements is preferably from 1 to 30 $\mu$m and more preferably from 1 to 10 $\mu$m.

The resistance value of the resistance heating elements can be changed dependently on their width or thickness. The above-mentioned ranges are however most practical. The resistance value becomes larger as the resistance heating elements become thinner and narrower.

By forming the resistance heating elements on the bottom face of the ceramic substrate, heat generated from the resistance heating elements diffuses in the whole of the ceramic substrate while the heat is conducted. Thus, temperature distribution in the heating face is made even so that temperatures of respective parts of the object to be heated are made even.

The resistance heating elements may have a rectangular section or an elliptical section. They desirably have a flat section. In the case of the flat section, heat is more easily radiated toward the wafer-heating face. Thus, a temperature distribution in the wafer-heating face is not easily generated.

The aspect ratio (the width of the resistance heating element/the thickness of the resistance heating element) of the section is desirably from 10 to 5000.

Adjustment thereof into this range makes it possible to increase the resistance value of the resistance heating elements and keep the evenness of the temperature in the wafer-heating face.

In the case that the thickness of the resistance heating elements is made to be constant, the amount of heat conduction toward the wafer-heating face of the heater plate 11 becomes small if the aspect ratio is smaller than the above-mentioned range. Thus, a thermal distribution similar to the pattern of the resistance heating elements is generated in the wafer-heating face. On the other hand, if the aspect ratio is too large, the temperature of the portions just above the centers of the resistance heating elements becomes high so that a thermal distribution similar to the pattern of the resistance heating elements is generated in the wafer-heating face. Accordingly, if temperature distribution is considered, the aspect ratio of the section is preferably from 10 to 5000.

When the resistance heating elements are formed on the surface of the ceramic substrate, the aspect ratio is desirably from 10 to 200.

The aspect ratio becomes larger in the case that the resistance heating elements are formed inside the ceramic substrate. The reason of this is because, if the resistance heating elements are formed inside, the distance between the wafer-heating face and the resistance heating elements becomes short and temperature evenness on the surface deteriorates so that it is necessary to make the resistance heating elements themselves flat.

The conductor containing paste is not particularly limited, and is preferably a paste containing not only metal particles or an electrically conductive ceramic for keeping electrical conductivity but also a resin, a solvent, a thickener and so on.

Examples of the resin used in the conductor containing paste include an epoxy resin, a phenol resin and the like. Moreover, an example of the solvent is isopropyl alcohol and the like. Examples of the thickener are cellulose and the like.

The above-mentioned metal particles are preferably, for example, a noble metal (gold, silver, platinum or palladium) lead, tungsten, molybdenum, nickel and the like. These are used in combination of two or more, in order to set the area resistivity to 50 m$\Omega$/□ or more.

These metals are not relatively easily oxidized, and have a resistance value sufficient for generating heat.

Examples of the above-mentioned electrically conductive ceramic include carbides of tungsten and molybdenum and the like. These may be used alone or in combination of two or more. The particle diameter of these metal particles or the electrically conductive ceramic particles is preferably from 0.1 to 100 $\mu$m. If the particle diameter is too fine, that is, below 0.1 $\mu$m, they are easily oxidized. On the other hand, if the particle diameter exceeds 100 $\mu$m, they are not easily sintered so that the resistance value becomes large.

The shape of the metal particles may be spherical or scaly. When these metal particles are used, they may be a mixture of spherical particles and scaly particles.

In the case that the metal particles are scaly or a mixture of spherical particles and scaly particles, metal oxides between the metal particles are easily held and adhesion between the resistance heating elements and the nitride ceramic and the like is made sure. Moreover, the resistance value can be made large. Thus, this case is advantageous.

It is desired to add a metal oxide to the metal particles in the conductor containing paste and make the resistance heating elements which is composed of a sintered body of the metal particles and the metal oxide, as described above. By sintering the metal oxide together with the metal particles in this way, the nitride ceramic or the carbide ceramic constituting the ceramic substrate can be closely adhered to the metal particles.

The reason why the adhesion to the nitride ceramic or the carbide ceramic by mixing the metal oxide is improved is unclear. However, it is considered that the surface of the metal particles, or the surface of the nitride ceramic or the carbide ceramic is slightly oxidized so that an oxidized film is formed. Pieces of this oxidized film are sintered and integrated with each other through the metal oxide so that the metal particles and the nitride ceramic or the carbide ceramic are closely adhered to each other.

It is preferred that the above-mentioned metal oxide is at least one selected from the group consisting of lead oxide, zinc oxide, silica, boron oxide ($B_2O_3$), alumina, yttria, and titania.

These oxides make it possible to improve particularly adhesion between the metal particles and the nitride ceramic or the carbide ceramic without increasing the resistance value of the resistance heating elements too much.

When the total amount of the metal oxides is set to 100 parts by weight, the rate of lead oxide, zinc oxide, silica, boron oxide ($B_2O_3$), alumina, yttria and titania is 1 to 10 for lead, 1 to 30 for silica, 5 to 50 for boron oxide, 20 to 70 for zinc oxide, 1 to 10 for alumina, 1 to 50 for yttria and 1 to 50 for titania at weight ratio. The weight ratio is desirably adjusted within the range that the total thereof does not exceed 100 parts by weight.

By adjusting the amounts of these oxides within these ranges, particularly adhesion to the nitride ceramic can be improved.

In the case that the resistance heating elements are formed on the bottom face of the ceramic substrate 11, a covering layer (reference to FIG. 2) 12a is desirably formed on the surface of the resistance heating elements. This is because the metal covering layer prevents a change in the resistance value based on oxidization of the inner sintered body. The thickness of the formed metal covering layer is preferably from 0.1 to 10 $\mu$m. In this case, the surface roughness of the resistance heating elements corresponds to the surface roughness of the covering layer.

However, in the case that the area resistivity of the resistance heating elements is as high as 50 m$\Omega$/□ or more, an electric current passes mainly through the covering layer if the covering layer is formed. Thus, the resistance heating elements do not function effectively. Therefore, in this case, the resistance heating elements may be exposed to the air without the formation of the covering layer. This is because an oxidized film in a passive state is formed by the exposure to the air, so that oxidization reaction at high temperature can be suppressed.

In the resistance heating element, an external terminal for connection to a power source is necessary. This external terminal is fixed to the resistance heating element through solder. An example of this external terminal 13 is a terminal made of Kovar.

In the case that the connecting terminal is connected, an alloy such as silver-lead, lead-tin or bismuth-tin can be used as the solder. The thickness of the solder layer is desirably from 0.1 to 50 $\mu$m. This is because this range is a range sufficient for ensuring connection based on the solder.

The following will describe a method for manufacturing a ceramic heater of the present invention.

(1) Manufacturing Process of a Ceramic Substrate

Powder of the above-mentioned nitride ceramic or carbide ceramic is blended with a sintering aid such as yttria, a binder and so on, based on the necessity, to prepare a slurry. Thereafter, this slurry is made into a granular form by spray-drying and the like. The granule is put into a mold and the like and pressed to be formed into a plate shape and the like. Thus, a raw formed body(green) is formed.

Next, this raw formed body is heated and fired to be sintered, and then a plate made of the ceramic is manufactured. Thereafter, the plate is made into a predetermined shape to manufacture the ceramic substrate. The shape of the raw formed body may be such a shape that the fired body can be used as it is. By heating and firing the raw formed body under pressure, the ceramic substrate having no pores can be manufactured. It is sufficient that the heating and the firing are performed at sintering temperature or more. The firing temperature is preferably from 1000 to 2500° C. for the nitride ceramic or the carbide ceramic.

Next, through holes for inserting supporting pins for supporting a silicon wafer 19, through holes 15 for inserting lifter pins 16, and bottomed holes 14 for burying temperature-measuring elements 18 such as thermocouples, are made in this ceramic substrate if necessary.

(2) Printing Process of a Conductor Containing Paste on the Ceramic Substrate

A conductor containing paste is generally a fluid including metal particles, a resin and a solvent, and has a high viscosity. This conductor containing paste is printed in portions where resistance heating elements are to be provided by screen printing and the like, to form a conductor containing paste layer. Since it is necessary that the resistance heating elements make the temperature of the whole of the substrate even, the conductor containing paste is desirably printed into a combined pattern of concentric circles and winding lines, as shown in FIG. 1.

The method of forming irregularities on the side faces of the heating element pattern includes the following three methods.

(a) An opening in a metal mask is subjected to sandblast treatment, to form irregularities on the sidewalls of the opening, and then the metal mask subjected to this treatment is used to print a conductor containing paste.

(b) An emulsion comprising a photosensitive resin is applied to a mesh plate, then a mask for exposure, in which an image is drawn and irregularities are previously formed on the side faces of the pattern thereof, is put thereon, and then exposure to light and development are performed, thereby forming an opening having no emulsion thereon. Thus, a screen printing plate is formed. Since the opening has the same pattern as printed in the mask for exposure, irregularities are formed along the contour of the opening of the plate. After that, this screen printing plate is used to print a conductor containing paste.

(c) Ordinary resistance heating elements, which have no irregularities on their side faces, are formed, and subsequently the resistance heating elements are subjected to trimming treatment so as to form irregularities on the side faces thereof.

The conductor containing paste is desirably formed in such a manner that a section of the resistance heating elements obtained after firing will be rectangular and flat.

(3) Firing of the Conductor Containing Paste

The conductor containing paste layer printed on the bottom face of the substrate is heated or fired to remove the resin and the solvent and sinter the metal particles. Thus, the metal particles are baked onto the bottom face of the substrate to form the resistance heating elements. The heating and firing temperature is preferably from 500 to 1000° C.

If the above-mentioned metal oxide is added to the conductor containing paste, the metal particles, the substrate and the metal oxide are sintered to be integrated with each other. Thus, the adhesion between the resistance heating elements and the substrate is improved.

(4) Only terminal portions of the formed resistance heating elements are desirably covered with nickel, a noble metal (gold, platinum, palladium or silver), and the like. In this case, therefore, portions other than the terminal connection portions are made exposed. For this purpose, a mask layer is formed on the portions other than the terminal portions of the resistance heating elements to form a covering layer on the terminal portions, and then the mask layer is removed to make the other portions of the resistance heating elements exposed.

(5) Fitting of External Terminals and so on

External terminals for connection to a power source are fitted up to ends of the circuits of the resistance heating elements with solder. Thermocouples are fixed into the bottomed holes 14 with brazing silver, brazing gold and the like. The bottomed holes are sealed with a heat resistant resin, such as a polyimide, so as to finish the manufacture of a ceramic heater 10.

The ceramic heater of the present invention may be made up to an electrostatic chuck by setting up an electrostatic electrode inside the ceramic substrate, or may be made up to a wafer prober by setting a chuck top conductor layer on the surface of the ceramic substrate and setting a guard electrode and a ground electrode inside thereof.

BEST MODE FOR CARRYING OUT THE INVENTION

EXAMPLE 1

Manufacturing of a Ceramic Heater Made of SiC (FIGS. 1 and 2)

(1) A composition comprising 100 parts by weight of SiC powder (average particle diameter: 0.3 µm), 4 parts by weight of $B_4C$ as a sintering aid, 12 parts by weight of an acrylic binder and an alcohol was subjected to spray-drying to prepare granular powder.

(2) Next, this granular powder was put into a mold and formed into a flat plate form to obtain a raw formed body (green)

(3) The raw formed body subjected to the working processing was degreased and then hot-pressed at 2100° C. and a pressure of 18 MPa to obtain a plate made of SiC and having a thickness of 3 mm.

Next, a surface of this plate was cut out into a disc having a diameter of 210 mm and the surface thereof was ground into a mirror plane until the Ra thereof became 0.1 µm. In this way, a ceramic substrate 11 was prepared.

(4) Next, a sol solution prepared by hydrolyzing and polymerizing a mixed solution of 25 parts by weight of tetraethylsilicate, 37.6 parts by weight of ethanol, and 0.3 part by weight of hydrochloric acid under stirring for 24 hours was applied to the bottom face of the ceramic substrate 11 by spin-coating. Next, the resultant product was dried at 80° C. for 5 hours, and was fired at 1000° C. for 1 hour, so as to form an insulating layer 180, which had a thickness of 2 µm and was comprising $SiO_2$, on the surface of the ceramic substrate 11 made of SiC.

The surface of the insulating layer 180 was substantially a mirror plane. The Ra thereof according to JIS B 0601 was 0.1 µm. The surface roughness was measured with a surface topography metrology system(P-11, made by KAL•Tencor Corporation).

The ceramic substrate 11 having the insulating layer 180 was drilled to form through holes 15 for inserting lifter pins for a silicon wafer 19, and bottomed holes 14 (diameter: 1.1 mm, depth: 2 mm) for burying thermocouples.

(5) A conductor containing paste was printed on the ceramic substrate 11 obtained through the above-mentioned process (4) by screen printing. The printed pattern was a combined pattern of concentric circles-like form and a winding line form, as shown in FIG. 1. Irregularities were formed on the contour of an opening of the screen by the following method. That is: an emulsion comprising a photosensitive resin was applied to a mesh plate; and then a mask for exposure, in which an image having irregularities having 3 µm in breadth previously formed on the side faces of the pattern thereof was drawn, was put thereon; exposure to light and development were performed, so as to form an opening having no emulsion thereon; and thus, a screen printing plate was obtained. Subsequently, terminal portions 13*a*, 13*b*, 13*c*, 13*d* and 13*e* were formed at end portions of the printed pattern.

The outer circumference of the resistance heating element formed areas was made 30 mm apart from the side face of the ceramic substrate.

The used conductor containing paste was a Ag—Pt paste comprising Ag: 50.5% by weight, Pt: 7.4% by weight, $SiO_2$: 1.6% by weight, $B_2O_3$: 4.1% by weight, ZnO: 7.0% by weight, PbO: 1.0% by weight, RuO: 7.1% by weight, resin binder: 3.4% by weight, and solvent: 17.9% by weight.

(6) Next, the ceramic substrate 11 on which the conductor containing paste was printed was heated and fired at 780° C. to sinter Ag—Pt in the conductor containing paste and bake Ag—Pt onto the substrate 11. Thus, resistance heating elements 12 were formed. The Ag—Pt resistance heating elements 12 had a thickness of 5 µm, a width of 2.4 mm and an area resistivity of 300 mΩ/□.

(7) Next, portions other than the terminal portions 13*a* to 13*f* of the resistance heating elements 12 were masked and subsequently the ceramic substrate 11 was immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) having a thickness of 1 μm on only the surfaces of the terminal portions 13a to 13f of the resistance heating elements 12.

(8) Next, by screen printing, a silver-lead solder paste (made by Tanaka Noble Metals.) was printed on the terminal portions 13a to 13f to form a solder layer.

Next, external terminals 17 made of Kovar were put on the solder layer and heated and reflowed at 420° C. to fit the external terminals 17 to the resistance heating elements 12 through the solder layer 170.

(9) Thermocouples for controlling temperature were fitted into the bottomed holes 14 and a ceramic adhesive agent (Aron ceramic, made by Toagosei Co., Ltd.) was buried into the holes to fix the thermocouples, so that a ceramic heater 10 was obtained.

EXAMPLE 2

Manufacturing of a Hot Plate Made of AlN (FIGS. 1 and 2)

(1) A composition comprising 100 parts by weight of aluminum nitride powder (made by Tokuyama Co., average particle diameter: 1.1 μm), 4 parts by weight of yttrium oxide ($Y_2O_3$: yttria, average particle diameter: 0.4 μm), 11.5 parts by weight of an acrylic binder, an alcohol was subjected to spray-drying to prepare granular powder.

(2) Next, this granular powder was put into a mold having a hexagonal section and formed into a hexagonal flat plate shape to obtain a raw formed body(green).

(3) The raw formed body subjected to the above processing was degreased and then hot-pressed at 1800° C. and a pressure of 20 MPa (200 kg/cm$^2$) to obtain an aluminum nitride sintered body having a thickness of 3 mm.

Next, this sintered body was cut out into a disc having a diameter of 210 mm. In this way, a plate made of the ceramic (ceramic substrate) was prepared.

Thereafter, a sol solution was used in the same way as in Example 1 to form an insulating layer 180 comprising $SiO_2$ and having a thickness of 2 μm on the surface of the ceramic substrate.

Next, the ceramic substrate on which the insulating layer was formed was drilled to form through holes 15 for inserting lifter pins for a silicon wafer 19, and bottomed holes 14 (diameter: 1.1 mm, depth: 2 mm) for burying thermocouples.

(4) A mask whose opening portions were made coarse by sandblast was used to print a conductor containing paste on the bottom face of the sintered body obtained in the above-mentioned process (3) The printed pattern was in a concentric circules-like form, and the size of irregularities on the opening portions in the mask was set to 20 μm.

This conductor containing paste was a Ag—Pt paste, and the composition thereof was: Ag: 49.2% by weight, Pt: 17.6% by weight, $SiO_2$: 0.7% by weight, $B_2O_3$: 1.8% by weight, ZnO: 3.9% by weight, PbO: 0.4% by weight, RuO: 5.1% by weight, resin binder: 3.4% by weight, and solvent: 17.9% by weight.

(5) Next, the ceramic substrate on which the Ag—Pt paste was printed was heated and fired at 780° C. to sinter Ag, Pt and so on in the conductor containing paste and bake them onto the sintered body. Thus, resistance heating elements were formed. The Ag—Pt resistance heating elements 32 had a thickness of 5 μm, a width of 2.4 mm and an area resistivity of 450 mΩ/□.

(6) Next, portions other than the terminal portions of the ceramic substrate manufactured in the above-mentioned (5) were masked and immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) having a thickness of 1 μm on the surfaces of the terminal portions 13a to 13f of the Ag—Pt resistance heating elements 12.

(7) Next, a brazing silver paste (made by Tanaka Noble metals) was printed on the terminal portions 13a to 13f by screen printing, to form a brazing silver layer.

Next, external terminals made of Kovar were put on the brazing silver layer and heated and reflowed at 900° C. to fit the external terminals to the surfaces of the resistance heating elements. Subsequently, sockets having conductive wires were fitted to the external terminals.

Thermocouples were inserted into the bottomed holes and a ceramic adhesive agent (Aron ceramic, made by Toagosei Co., Ltd.) was buried into the holes to fix the thermocouples. In this way, a ceramic heater was obtained.

EXAMPLE 3

A ceramic heater was manufactured in accordance with the method of Example 2. The size of irregularities of the opening in the screen printing plate was set to 110 μm.

EXAMPLE 4

A ceramic heater was manufactured in accordance with the method of Example 2. The size of irregularities of the opening in the screen printing plate was set to 100 μm.

EXAMPLE 5

A ceramic heater was manufactured in accordance with the method of Example 2. The size of irregularities of the opening in the screen printing plate was set to 0.05 μm.

COMPARATIVE EXAMPLE 1

A ceramic heater was manufactured in the similar to Example 1 except that: a mask in which a heating element pattern having no irregularities was drawn was used to form a screen printing plate; and this screen printing plate having, on the contour of its opening, no irregularities was used to form a conductor containing paste layer by screen printing.

COMPARATIVE EXAMPLE 2

A ceramic heater was manufactured in accordance with the method of Example 2. The size of irregularities of the opening in the screen printing plate was set to 0.01 μm.

COMPARATIVE EXAMPLE 3

A ceramic heater was manufactured in accordance with the method of Comparative Example 1. The printed pattern was in the form of only combined straight lines. The evenness of the temperature on the semiconductor wafer heating face is not desired at all.

The hot plates of Examples 1 to 3 and Comparative Example 1 were subjected to a heat cycle test in which temperature-rise/temperature-drop were repeated 500 times within the temperature range of 25 to 350° C., so as to examine whether or not the resistance heating elements exfoliated.

Furthermore, a thermoviewer (TC-136 type, made by Japan Datum Co.) was used to measure a difference between the highest temperature and the lowest temperature of each of the heating faces at 300° C. These results are shown in Table 1 described below.

TABLE 1

|  | Exfoliation of the resistance heating elements after the heat cycle test | Temperature difference between the highest temperature and the lowest temperature (° C.) |
|---|---|---|
| Example 1 | Not found | 4 |
| Example 2 | Not found | 4 |
| Example 3 | Not found | 9 |
| Example 4 | Not found | 4 |
| Example 5 | Not found | 5 |
| Comparative Example 1 | Found | 6 |
| Comparative Example 2 | Found | 6 |
| Comparative Example 3 | Not found | 15 |

As can be seen from the results shown in the above-described Table 1, by forming the irregularities on the side faces of the resistance heating elements, the ceramic heater wherein the resistance heating elements did not exfoliate easily from the ceramic substrates, even if the heat cycle test was performed, was obtained; and the temperature of the heating face was made even.

In the ceramic heaters according to Examples 1 to 2 and Examples 4 to 5, it was possible to set a temperature difference between the highest temperature and the lowest temperature within 2% of the set temperature (300° C.), that is, within 6° C.

INDUSTRIAL APPLICABILITY

As described above, according to the present invention, a resistance heating element having, on its side face, irregularities, is formed on the bottom face of a ceramic substrate, whereby adhesion strength of the resistance heating element to the ceramic substrate can be improved.

What is claimed is:

1. A ceramic heater for a semiconductor producing/examining device comprising:

a ceramic substrate;

a resistance heating element formed on a surface of said ceramic substrate, wherein irregularities are formed on a side face of said resistance heating element, and said irregularities on the side face have a variation between maximum and minimum points of 100 $\mu$m or less.

2. The ceramic heater according to claim 1, wherein said resistance heating element is formed to be drawn as a curve.

3. The ceramic heater according to any of claim 1, wherein said ceramic substrate is a carbide ceramic or a nitride ceramic.

4. The ceramic heater according to claim 2, wherein said ceramic substrate is a carbide ceramic or a nitride ceramic.

5. The ceramic heater according to claim 1, wherein the variation of said irregularities on the side face is 0.05 to 100 $\mu$m.

6. The ceramic heater according to claim 1, wherein said resistance heating element is formed by sintering metal particles.

7. The ceramic heater according to claim 1, wherein said ceramic heater comprises an insulating layer on a surface of said ceramic substrate.

8. The ceramic heater according to claim 1, wherein said resistance heating element comprises a pattern of concentric circles;

the combination of concentric circle-like shapes and the winding line shape; a spiral; eccentric circles or winding lines.

* * * * *